(12) United States Patent
Conard

(10) Patent No.: US 6,734,680 B1
(45) Date of Patent: May 11, 2004

(54) GROUND FAULT INTERRUPT ANALYZER METHOD AND APPARATUS

(76) Inventor: Albert F. Conard, 33975 Washington St., Winchester, CA (US) 92596

( * ) Notice: Subject to any disclaimer, the term of this patent is extended or adjusted under 35 U.S.C. 154(b) by 181 days.

(21) Appl. No.: 10/124,865

(22) Filed: Apr. 18, 2002

Related U.S. Application Data
(60) Provisional application No. 60/287,490, filed on Apr. 30, 2001.

(51) Int. Cl.[7] ............................................. G01R 31/14
(52) U.S. Cl. ........................ 324/509; 324/508; 361/42
(58) Field of Search .................... 324/508, 509–511, 324/537; 361/42

(56) References Cited

U.S. PATENT DOCUMENTS

| | | | | |
|---|---|---|---|---|
| 6,011,398 A | * | 1/2000 | Bald et al. | 324/511 |
| 6,445,196 B1 | * | 9/2002 | White | 324/726 |
| 6,657,435 B2 | * | 12/2003 | Brown | 324/508 |

* cited by examiner

Primary Examiner—N. Le
Assistant Examiner—Vincent Q. Nguyen
(74) Attorney, Agent, or Firm—Squire, Sander & Dempsey, LLP

(57) ABSTRACT

A method and apparatus for testing whether a particular outlet is connected to a particular GFCI, which eliminates the need for having the electrical network turned on.

32 Claims, 2 Drawing Sheets

… (usually four to six milli-amps).

GROUND FAULT INTERRUPT ANALYZER METHOD AND APPARATUS

CROSS-REFERENCE TO RELATED APPLICATION

This application claims the benefit of U.S. Provisional Application No. 60/287,490 filed Apr. 30, 2001, whose entire contents are hereby incorporated by reference.

BACKGROUND OF THE INVENTION

In an electrical power network (such as a home or office network including outlets, hot wires, neutral wires, ground wires, etc.) a ground fault is a current leak that occurs when an energizing conductor (hot or neutral wire) faults to the outside or frame or chassis of an electrically powered device. If the hot wire in an electrical network faults to a grounded chassis, the current flow may be enough to seriously injure or kill someone touching the chassis. Furthermore, if a neutral conductor faults to ground, the chassis may still be a source of dangerous fault currents.

Ground-fault circuit interrupters (herein GFCIs) are designed to automatically shut off power to a load such as electrical equipment if a difference (i.e., an imbalance) between the hot conductor current and neutral conductor current is detected. Simply, the GFCI monitors the amount of current flowing from the Hot to the Neutral, and if there is any imbalance it trips the circuit. GFCI's accomplish the above typically by testing for two conditions: (1) A Hot to Ground (safety/earth) fault. Current flows from the Hot wire to Ground bypassing the Neutral. This is the test that is most critical for safety. (2) A grounded Neutral fault. Due to mis-wiring or a short circuit, the neutral and ground wires are connected by a low resistance path downstream of the GFCI. In this case, the GFCI will trip as soon as power is applied even if nothing is connected to its protected (load) circuit.

Electrical power networks such as household wiring networks may include a number of GFCI outlets, which contain the necessary circuitry to detect current imbalances and trip circuits if necessary. Other downstream receptacles (outlets) connected in series to a particular GFCI are protected by that GFCI.

A GFCI will usually contain a "test" button and a "reset" button. The "test" button causes a small difference between the "hot" and "neutral" currents to test the GFCI. For example, if a lamp were plugged into an outlet protected by a GFCI and turned on, and the test button pressed on the GFCI, the GFCI would apply an "extra" current and if it is functioning properly will detect the imbalance and trip the circuit. The lamp would subsequently turn off. The "reset" button, while pressed, opens the neutral connection and resets the GFCI. Once the "reset" button is pressed and released, the GFCI is reset, and the neutral is closed.

Typically, prior art methods for testing whether an outlet is protected by a particular GFCI (i.e., continuity testing) require that power to the electrical network be turned on. In the prior art method a load, such as a lamp, is plugged into a receptacle suspected to be protected by a particular GFCI. The test button on the GFCI is pressed and if the receptacle is protected by that GFCI, the equipment plugged into that receptacle turns off. Also, a prior art receptacle tester may be used which may be plugged into any outlet suspected of being connected to a particular GFCI. A button on the receptacle tester trips the GFCI connected to that receptacle. The receptacle, if protected by a GFCI, would then be non-functional. A user then would have to press the "reset" button on the GFCI suspected to protect the particular receptacle and again determine if the receptacle is functional. If the receptacle was functional again, the GFCI which had its reset button pressed and released would be determined to be connected to that particular receptacle.

To measure the actual trip current of a GFCI requires a GFCI tester. The tester allows a person to read the actual GFCI trip current on a meter, identifying the GFCI's that do or do not operate within the required milli-amp range (usually four to six milli-amps).

There are a number of problems with the prior art method of determining whether a particular receptacle is connected to a GFCI. If testing requires tripping the GFCI, the power to the electrical network must be turned on, generally increasing the risk of electrical shock. Furthermore, if testing for whether a receptacle is connected to a GFCI requires tripping the GFCI by pressing the "test" button, it is inconvenient in that either two people must be involved (i.e., one to push the test button, and the other to determine if a particular outlet is functioning) or one person must first press the test button and then travel to the location of the receptacle to determine if it is functioning.

SUMMARY OF THE INVENTION

One aspect of the present invention is to provide a method of testing for whether or not a particular outlet is connected to a particular GFCI, which eliminates the need for having the electrical network turned on.

Another aspect of the present invention is to provide a method and apparatus for testing whether or not a particular outlet is connected to a particular GFCI, which eliminates the need for tripping the GFCI.

Yet another aspect of the present invention is to provide a method of testing for whether or not a particular outlet is connected to a particular GFCI, which allows one individual to conveniently test multiple receptacles without having to go back and forth from the GFCI and the receptacle.

These and other aspects are achieved by the apparatus and system of the present invention which, in accordance with a broad structural aspect of the invention, include a circuit device with a power source, an output device (such as a light for example) which derives power from the power source, and connection prongs. One embodiment of the present invention is adapted to mate with a standard three prong receptacle in an electrical network, where the power to the electrical network is turned off. At some point in an electrical network, the ground and the neutral should be connected together. When the device of the present invention mates with the electrical network, a circuit is completed, allowing the output device to derive power from the power source and activate. If the reset button is then pressed on a particular GFCI, the neutral wire should open. If the receptacle that the device is plugged into is connected to the GFCI whose reset button is pressed, the circuit should break, and the output device should turn off, thus indicating the receptacle is connected to that GFCI. If the output device does not turn off, this may indicate faulty wiring or that the receptacle may be connected to another GFCI.

In another exemplary embodiment, the present invention includes a first circuit apparatus with three standard prongs, and an output device (such as a light for example) connected to two of the prongs which are adapted to mate with the "hot" and "neutral" connections on a receptacle in an electrical network. This exemplary embodiment also includes a second circuit apparatus with three standard prongs, a power source connected to two of the prongs which are adapted to mate with the "hot" and "neutral" connections on a receptacle in an electrical network.

The second circuit apparatus is plugged into a receptacle, such as a GFCI receptacle. The first circuit apparatus is plugged into a different receptacle, suspected to be connected to the GFCI receptacle. If the receptacles are in fact connected, a circuit will be completed, allowing the output device of the first apparatus to derive power from the power source of the second apparatus and activate. This would indicate the receptacles are connected.

Other objects and advantages of the present invention will become more apparent to those persons having ordinary skill in the art to which the present invention pertains from the foregoing description taken in conjunction with the accompanying drawings.

DETAILED DESCRIPTION OF PREFERRED EMBODIMENTS OF THE INVENTION

This description is not to be taken in a limiting sense, but is made merely for the purpose of illustrating the general principles of the invention. Accordingly, the invention will be described with respect to an output device such as a light bulb or a sound source such as a speaker. It is to be understood that the particular output described herein is for illustration only; the invention also applies to other resistive loads which may indicate activation.

The description of exemplary and anticipated embodiments of the invention are not intended to be exhaustive or to limit the invention to the precise forms disclosed. Many modifications and variations are possible in light of the teachings herein.

Figure 1:
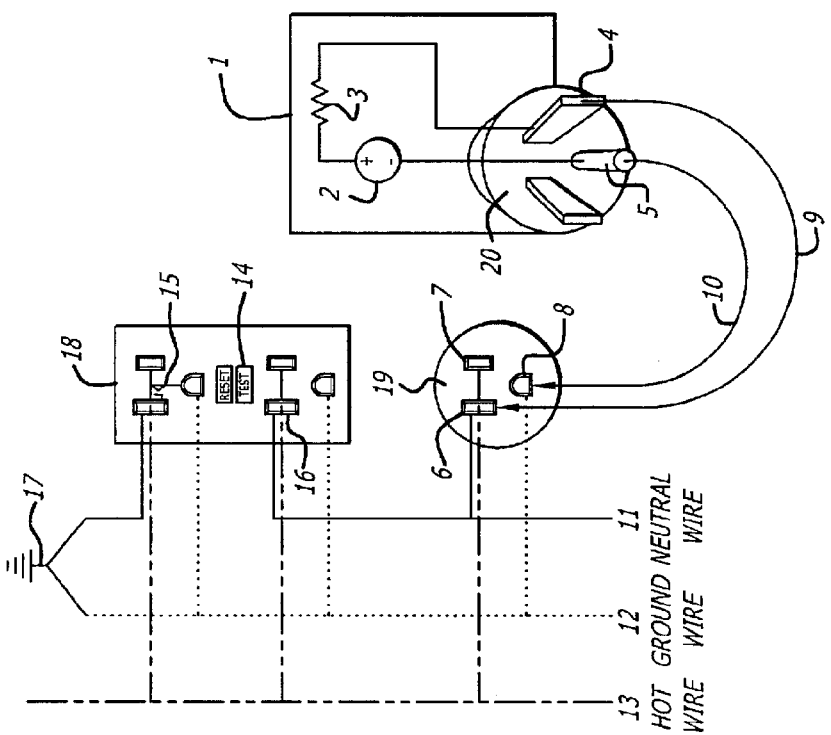
FIG. 1 shows a structural diagram for the present invention.

FIG. 1 shows an exemplary embodiment of the present invention for determining whether or not an outlet is connected to a particular GFCI. Referring thereto is a circuit apparatus 1, with a power source 2, an output device 3 modeled as a resistive load, a standard three prong plug 20 with a "neutral" prong 4 and a ground prong 5. Standing alone, the apparatus 1 is an open circuit, and the output device 3 is in the "off" state. The output device 3, modeled as a resistive load, may be a light bulb, a speaker, a display, or any device which may indicate that the circuit is complete. Thus if a current conducting wire were to connect prong 4 and prong 5, the output device would turn "on".

In common electrical wiring networks in homes, office complexes, buildings, apartments, etc., multiple receptacles on the same circuit have a common "hot" wire 13, a common "ground" wire 12 and a common "neutral" wire 11. Both the neutral wire 11 and the ground wire 12 are tied together at ground 17 though they run on independent paths to ground. A GFCI 18 that is located on a circuit protects all of the receptacles on that circuit.

When the plug 20 on the apparatus 1 of the present invention is plugged into a standard receptacle 19, the "neutral" prong 4 will mate 9 with the "neutral" slot 6 on the receptacle 19, and the "ground" prong 5 will mate 10 with the "ground" slot 8 on the receptacle 19. The ground wire 12 and the neutral wire 11 are connected together at 17. Thus, when the apparatus 1 is plugged into the receptacle 19, a complete circuit is formed, causing current to flow through the output device 3, causing the output device 3 to turn "on".

The GFCI 18 connected to the circuit 11, 12, 13 protects all receptacles 19 on that circuit. For exemplary purposes, only one receptacle is shown 19. However, it is to be understood that the GFCI 18 may protect any number of receptacles on a circuit. The GFCI 18 is shown without its internal components which are well known to one ordinarily skilled in the art, and do not affect the circuit logic shown in FIG. 1. Any number of commercially available GFCI's may be used in common household and building wiring networks. The GFCI 18 has a test button 14. As is typical with GFCI's, while the test button is pressed, the neutral wire 11 is opened 15. If the receptacle 19 that the apparatus 1 is plugged into is connected to the GFCI 18 whose test button 14 is pressed, the circuit should break, and the output device 3 should turn off, thus indicating the receptacle is connected to that GFCI 18. If the output device 3 does not turn off, this may indicate faulty wiring or that the receptacle may be connected to another GFCI.

Figure 2:
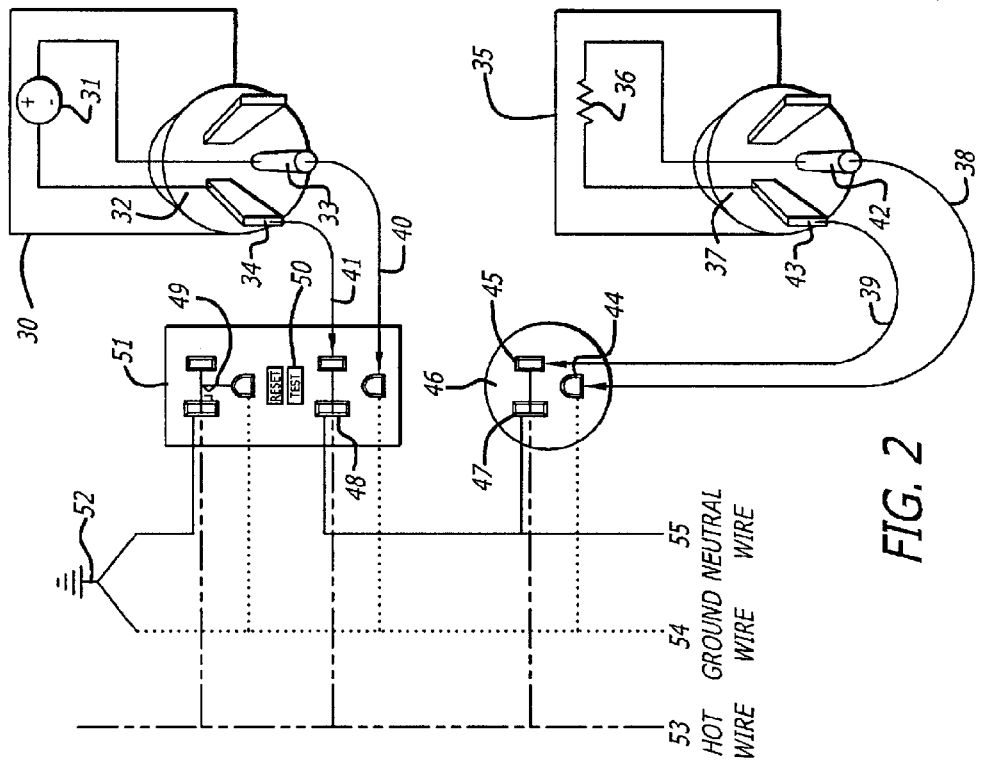
FIG. 2 shows a broad structural diagram for the present invention.

FIG. 2 illustrates an alternative embodiment of the present invention for determining whether or not an outlet is connected to another outlet, such as a GFCI outlet, when power to the electrical network is off (i.e., the "hot" wire conducts no current). Referring thereto is an output indicator circuit 35, with an output device 36 modeled as a resistive load, a standard three prong plug 37 with a "hot" prong 43 and a ground prong 42 connected to the output device 36. A power supply circuit is shown at 30 which contains a power supply 31 such as a battery, a standard three prong plug 32 with a "hot" prong 34 and a ground prong 33 connected to the power supply 31.

When the plug 32 on the power supply circuit 30 of the present embodiment is plugged into a receptacle, such as a GFCI receptacle 51, the "hot" prong 34 will mate 41 with the "hot" slot on the receptacle 51, and the "ground" prong 33 will mate 40 with the "ground" slot on the receptacle 51. When the plug 37 on the output indicator circuit 35 of the present embodiment is plugged into a receptacle 46, the "hot" prong 43 will mate 39 with the "hot" slot 45 on the receptacle 46, and the "ground" prong 42 will mate 38 with the "ground" slot 44 on the receptacle 46.

If the output indicator device 35 is plugged into a receptacle 46 and the power supply circuit 30 is not plugged into any receptacle on the same network (on the same "hot" and "ground" wires), the output device 36 should remain "off". If the output device 36 turns "on" in this scenario, this will indicate to the user that there may be a short between the "hot" and "ground" wires 53, 54 somewhere in the network.

If the output indicator device is plugged into a receptacle and the output device is off (while the power supply circuit is not plugged into any receptacle on the same network), a user may then plug the power supply circuit 30 into a receptacle, such as a GFCI receptacle 51, suspected to be on the same network. If the receptacles 51, 46 into which the power supply circuit 30 and the output indicator circuit 35 are plugged into are connected together, a complete circuit may be formed, and the power supply circuit 30 will supply power to the output device 36 on the output indicator circuit 35. The output device 36 will then turn "on" if there are no other open wires, indicating to the user that the receptacles 51, 46 are connected together. If one of the receptacles is a GFCI receptacle 51, this will indicate that the other receptacle is protected by that particular GFCI.

If the receptacles are not connected together, or there is an open circuit, the output device 36, which may be a light source or sound source or any other output indicator, will not turn "on".

Figure 3:
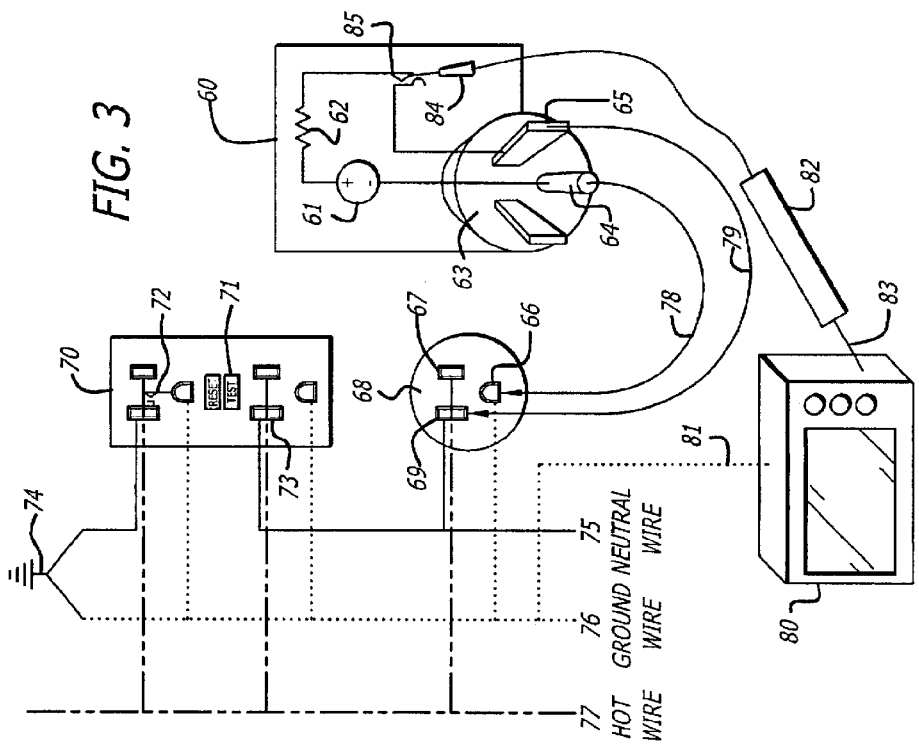
FIG. 3 illustrates by way of example, a broad structural diagram for the present invention.

FIG. 3 shows an alternative embodiment of the present invention for determining whether or not a device capable of conducting current, such as a metal frame or chassis 80, is connected to a "ground" wire. Referring thereto is a circuit apparatus 60, with a power source 61, an output device 62 modeled as a resistive load, a standard three prong plug 63 with a "neutral" prong 65 and a "ground" prong 64. The device also contains a closed circuit jack 85 adapted to mate with the connector 84 of a testing prong 82. If the connector 84 is not connected to the jack 85 the device 60 is identical to that of the device 1 in FIG. 1, and performs the same function. However, if the connector 84 mates with the jack 85, the neutral prong 65 is "broken" from the circuit. Thus if device 60 were plugged into a receptacle 68 or 70 with the connector 84 plugged into the jack 85, the output device 62 would remain "off".

If however the tip 83 of the testing prong 82 were conductively coupled to ground 76, either directly or indirectly, and the device 60 were plugged into a receptacle, the circuit would complete and the output device 62 would turn "on". This would allow a user to plug the device 60 into a receptacle and test whether or not a device, such as a metal frame or any object or device capable of conducting current, was grounded. The user could touch the tip 83 of the testing prong 82 to the suspected device, and if it is grounded, the output device would turn "on".

In all of the above embodiments and descriptions it is to be understood that circuit components arranged in series, such as the power supplies and resistive loads may be swapped, without having any impact on the functional logic of the circuit.

Figure 4:
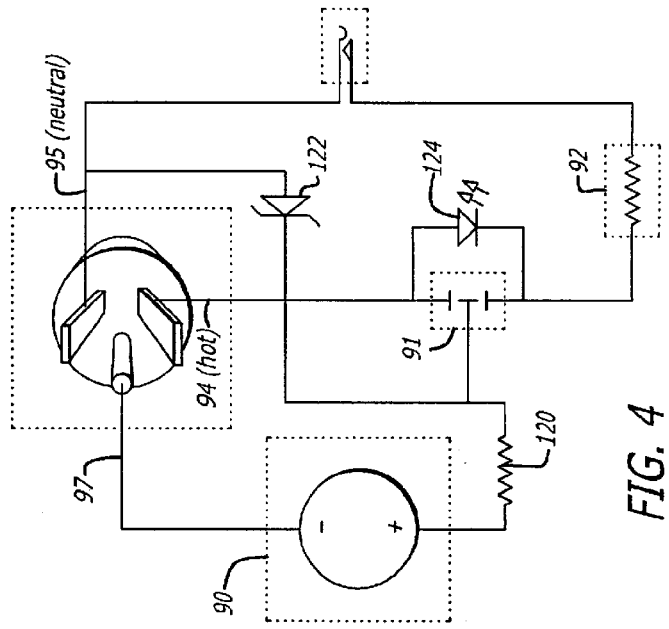
FIG. 4 shows a broad structural diagram for the present invention.

FIG. 4 shows a further embodiment of the present invention, which functions as both a power supply circuit as illustrated by 30 and the circuit apparatus illustrated by 60. The device includes a two way switch 91 which allows one end of the power supply 90 to be conductively coupled, via a resistor 120 (100 ohms for 3V supply, and 500 ohms for 9V supply), to either the "hot" prong 94 on the standard three prong plug 94 or the output device 92 (that could be a green light emitting diode), output jack 93 and the neutral prong 95, which are all in series. A red light emitting diode (LED) 124 connected across the switch provides visual cue regarding the state of the switch. When the switch couples one end of the power supply to the "hot" prong 94 the circuit in FIG. 4 behaves identical to the power supply circuit as illustrated by 30. When the switch couples one end of the power supply to the resistive load, output jack, and neutral prong (in series), the circuit in FIG. 4 behaves identical to the circuit apparatus illustrated by 60. Additionally, an unidirectional switch such as a zener diode 122 with a predetermined rating (2.5V in the present case) has its anode connected to neutral 95 at one end, and the cathode of the diode is connected to one end of the resistor 120 (the end being opposite the end that is connected to the power supply).

It is noted that specific illustrative embodiments of the invention have been disclosed hereinabove. However, it is to be understood that the invention is not limited to these specific embodiments.

What is claimed is:

1. A method of testing, comprising:
   providing a circuit assembly having a ground prong, a neutral prong, a series-circuit including a power supply and an output device connected in series, wherein the series circuit is coupled to the ground prong and coupled to the neutral prong;
   plugging the circuit assembly into an electrical receptacle;
   observing if the output device turns on;
   pushing a test button on a Ground Fault Circuit Interrupter; and
   testing electrical continuity by observing if the output device turns off.

2. A method according to claim 1 wherein the power supply of the series-circuit is a battery.

3. A method according to claim 1 wherein the output device of the series-circuit is a light bulb.

4. A method according to claim 1 wherein the output device of the series-circuit is a sound source.

5. A method according to claim 1 wherein the providing precedes the plugging which precedes the observing which precedes the pushing which precedes the testing.

6. A method of testing, comprising:
   providing a first circuit assembly having a ground prong, a hot prong, a power supply, wherein the power supply is coupled to the ground prong and coupled to the hot prong;
   providing a second circuit assembly having a ground prong, a hot prong, an output device, wherein the output device is coupled to the ground prong and coupled to the hot prong;
   plugging the first circuit assembly into a first electrical receptacle;
   plugging the second circuit assembly into a second electrical receptacle; and
   observing if the output device turns on which thereby tests for electrical continuity.

7. A method according to claim 6 wherein the power supply is a battery.

8. A method according to claim 6 wherein the output device is a light bulb.

9. A method according to claim 6 wherein the output device is a sound source.

10. A method of testing, comprising:
    providing a testing prong;
    providing a circuit assembly having a ground prong, a neutral prong, a series-circuit including a power supply and an output device connected in series and coupled to the ground prong, a closed circuit jack adapted to mate with the testing prong, connected to the series circuit and coupled to the neutral prong;
    plugging the circuit assembly into an electrical receptacle;
    plugging the testing prong into the closed circuit jack;
    applying the testing prong to a surface; and
    observing if the output device turns on which thereby tests for ground continuity.

11. A method according to claim 10 wherein the circuit assembly plugging precedes the testing prong plugging which precedes the applying which precedes the observing.

12. A method according to claim 10 wherein the output device is a light bulb.

13. A method according to claim 10 wherein the power supply is a battery.

14. A method according to claim 10 wherein the output device is a sound source.

15. An apparatus comprising:
    a ground prong;
    a neutral prong; and a series-circuit including a power supply and an output device conductively connected to the power supply, wherein the series-circuit is coupled to the ground prong and coupled to the neutral prong.

16. The apparatus according to claim 15 wherein the ground prong and the neutral prong are adapted to couple to an electrical network.

17. An apparatus according to claim 15 wherein the output device is a light.

18. An apparatus according to claim 15 wherein the output device is a sound source.

19. An apparatus according to claim 15 wherein the power supply is a battery.

20. An apparatus comprising:
    a first circuit assembly including
        a ground prong,
        a hot prong, and
        a power supply conductively coupled to the ground prong and the hot prong; and
    a second circuit assembly including
        ground prong,
        hot prong, and
        an output device conductively coupled to the ground prong and the hot prong;
    wherein the first and second circuit assemblies may be conductively coupled together when the first and second circuit assemblies are plugged into electrical receptacles.

21. An apparatus according to claim 20 wherein if the first and second circuit assemblies are conductively coupled together when the first and second circuit assemblies are plugged into electrical receptacles, the output device turns on.

22. An apparatus according to claim 20 wherein the output device is a light.

23. An apparatus according to claim 20 wherein the output device is a sound source.

24. An apparatus according to claim 20 wherein the power supply is a battery.

25. An apparatus comprising:
    an output device;
    a ground prong;
    a power supply conductively coupled to the ground prong;
    a neutral prong;
    a closed loop jack conductively coupled to the neutral prong and to the output device;
    a hot prong; and
    a switch with positionable in a first position and a second position, wherein the switch conductively couples the hot prong to the power supply when in the first position and conductively couples the output device to the power supply in the second position.

26. An apparatus according to claim 25 further including a testing prong conductively coupled to the closed loop jack.

27. An apparatus according to claim 26 wherein the switch is in the second position; and wherein if the testing prong is coupled to a grounded conducting object, the output device turns on.

28. An apparatus comprising:
    a ground prong;
    a hot prong;
    a power supply conductively coupled to the ground prong and the hot prong;
    wherein the ground prong and hot prong are adapted to mate with an electrical receptacle; and
    wherein the power supply supplies power to a load connected in series to the electrical receptacle.

29. An apparatus according to claim 28 wherein the power supply is a battery.

30. An apparatus comprising:
    a ground prong;
    a hot prong;
    an output device conductively coupled to the ground prong and the hot prong;
    wherein the ground prong and hot prong are adapted to mate with an electrical receptacle; and
    wherein the output device derives power from a power source connected in series to the electrical receptacle.

31. An apparatus according to claim 30 wherein the output device is a light.

32. An apparatus according to claim 30 wherein the output device is a sound source.

* * * * *